United States Patent [19]
Clark et al.

[11] Patent Number: 5,693,154
[45] Date of Patent: Dec. 2, 1997

[54] TERBIUM-DYSPROSIUM-ZINC AND TERBIUM-GADOLINIUM-ZINC MAGNETOSTRICTIVE MATERIALS AND DEVICES

[75] Inventors: Arthur E. Clark, Adelphi; James B. Restorff, College Park; Marilyn Wun-Fogle, Gaithersburg, all of Md.

[73] Assignee: The United States of America as represented by the Secretary of the Navy, Washington, D.C.

[21] Appl. No.: 627,199

[22] Filed: Apr. 3, 1996

[51] Int. Cl.⁶ .................................... H01F 1/053
[52] U.S. Cl. .................. 148/301; 420/416; 310/26; 335/215
[58] Field of Search .............. 148/301; 420/416; 310/26; 335/215

[56] References Cited

U.S. PATENT DOCUMENTS 4,308,474  12/1981  Savage et al. ........................ 310/26
4,378,258  3/1983  Clark et al. ........................ 148/100
4,906,879  3/1990  Clark ................................ 310/26

OTHER PUBLICATIONS

P. Morin and J. Pierre, "Magnetic Anisotrophy of Rare Earth–Zinc Equiatomic Compounds TbZn and HoZn", *Solid State Com.* 13, (1973) pp. 537–540.

A.E. Clark et al., "Piezomagnetic properties and ΔE effect in TbZn at 77K," Journal of *Magnetism and Magnetic Materials*, 140–144 (1995), pp. 1151–1152.

P. Morin et al., "Magnetoelastic properties of RZn equiatomic compounds," *Phys. Rev. B*, 16, pp. 3182–3193 (1977).

*Primary Examiner*—John Sheehan
*Attorney, Agent, or Firm*—John Forrest; Jacob Shuster

[57] ABSTRACT

Polycrystalline or single crystal magnetostrictive alloys of the formula $Tb_{1-x}Dy_xZn_w$ ($0<x\leq0.7$; $0.90\leq w\leq1.10$) and $Tb_{1-y}Gd_yZn_w$ ($0<y\leq0.4$; $0.90\leq w\leq1.10$) and magnetostrictive transducer elements made of these alloys.

59 Claims, 3 Drawing Sheets

TERBIUM-DYSPROSIUM-ZINC AND TERBIUM-GADOLINIUM-ZINC MAGNETOSTRICTIVE MATERIALS AND DEVICES

BACKGROUND

This invention relates to magnetostrictive materials and more particularly to magnetostrictive materials containing rare earths.

There is a strong interest in developing a high power transduction element which can function at temperatures accessible with high temperature superconducting wires. There is also an interest in developing new, improved high power transducer elements for use with low temperature superconducting wires at cryogenic temperatures. Lossless superconducting wires can be used to generate the necessary magnetic fields for the transducers.

It has been known for many years that huge magnetostrictions are available in rare earth elements and alloys. These rare earths are the kernel building blocks of the transduction elements. As early as 1963 magnetostrictions ~10000 ppm were found in the rare earths Tb and Dy at cryogenic temperatures. Later in 1971, magnetostrictions ~2000 ppm were found in TbFe$_2$ at room temperature (U.S. Pat. No. 4,378,258). More recently, U.S. Pat. No. 4,906,879 disclosed a transducer element made of Tb$_x$Dy$_{1-x}$ alloy (with x≅0.6) that operates at 77K, a temperature accessible with the new high temperature superconducting (HTSC) coils. Using this alloy, transducer element strains exceed ~5000 ppm using only moderate excitation magnetic fields of 500 Oe.

While the performance of the Tb$_x$Dy$_{1-x}$ alloys is excellent, the transducer elements suffer because the materials are very ductile. In fact, under the high bias stress conditions required for high power operation (stress >3 ksi), the element material flows and deforms which substantially reduces both magnetostriction and coupling factor. Because of the ductility, the material is difficult to mount into position.

Although it is desirable to provide good magnetostrictive materials will low ductility, the materials should not be too brittle so it can be drilled and tapped.

SUMMARY

An object of this invention is to provide new magnetostrictive materials for high power transducers.

Another object of this invention is to provide new high power magnetostrictive transducer elements that do not require casings to prevent deformation.

A further object of this invention is to provide new high power magnetostrictive transducer elements that operate efficiently at temperatures where high temperature superconducting wires conduct losslessly.

Yet another object of this invention is to provide high power magnetostrictive elements that operate efficiently at temperatures where conventional low temperature superconductors conduct losslessly.

These and other objects of this invention are achieved by providing:

Crystalline magnetostrictive materials of the formula Tb$_{1-x}$Dy$_x$Zn$_w$ or of the formula Tb$_{1-y}$Gd$_y$Zn$_w$, wherein x is from more than zero to about 0.7, y is from more than zero to about 0.4, and w is from about 0.90 to about 1.10. The crystalline materials may be polycrystalline or more preferably single crystal.

The Tb$_{1-x}$Dy$_x$Zn$_w$ materials are useful for magnetostrictive transducer elements in high power magnetostrictive transducers with operating temperatures of from less than 63K down to near 0K. Conventional electrical conductors such as copper, copper alloys, aluminum, aluminum alloys, silver, silver alloys, gold, or gold alloys may be used to provide electrical conductive paths for the generation of magnetic fields for the transducer elements or for the detection of changes in magnetic field produced by the transducer elements over this entire temperature range. Or preferably superconductors may be used to provide lossless electrical conductive paths for the generation of or the detection of the magnetic fields. For operating temperatures of from about 15K to near 0K (for example cryogenic temperatures), low temperature superconducting metal alloys (Nb-Ti, Nb-Sn, Nb-Zr, etc.) can be used to provide the lossless electrical conducting paths. For higher temperatures of from about 15K to less than 63K, high temperature superconductors can be used.

The Tb$_{1-y}$Gd$_y$Zn$_w$ materials are useful as magnetostrictive transducer elements in high power magnetostrictive transducers operating at temperatures of from more than 63K up to just above 77K. Conventional electrical conductors may be used for the generation of magnetic fields for the transducers or for the detection of changes in magnetic fields produced by the transducer elements. Or preferably high temperature superconductors can be used to provide lossless electrical conducting paths for the generation of or the detection of magnetic fields.

DESCRIPTION OF THE DRAWINGS

A more complete appreciation of the invention and many of its attendant advantages will be readily appreciated as the same becomes better understood by reference to the following detailed description when considered in connection with the accompanying drawings wherein.

DETAILED DESCRIPTION

Figure 1:
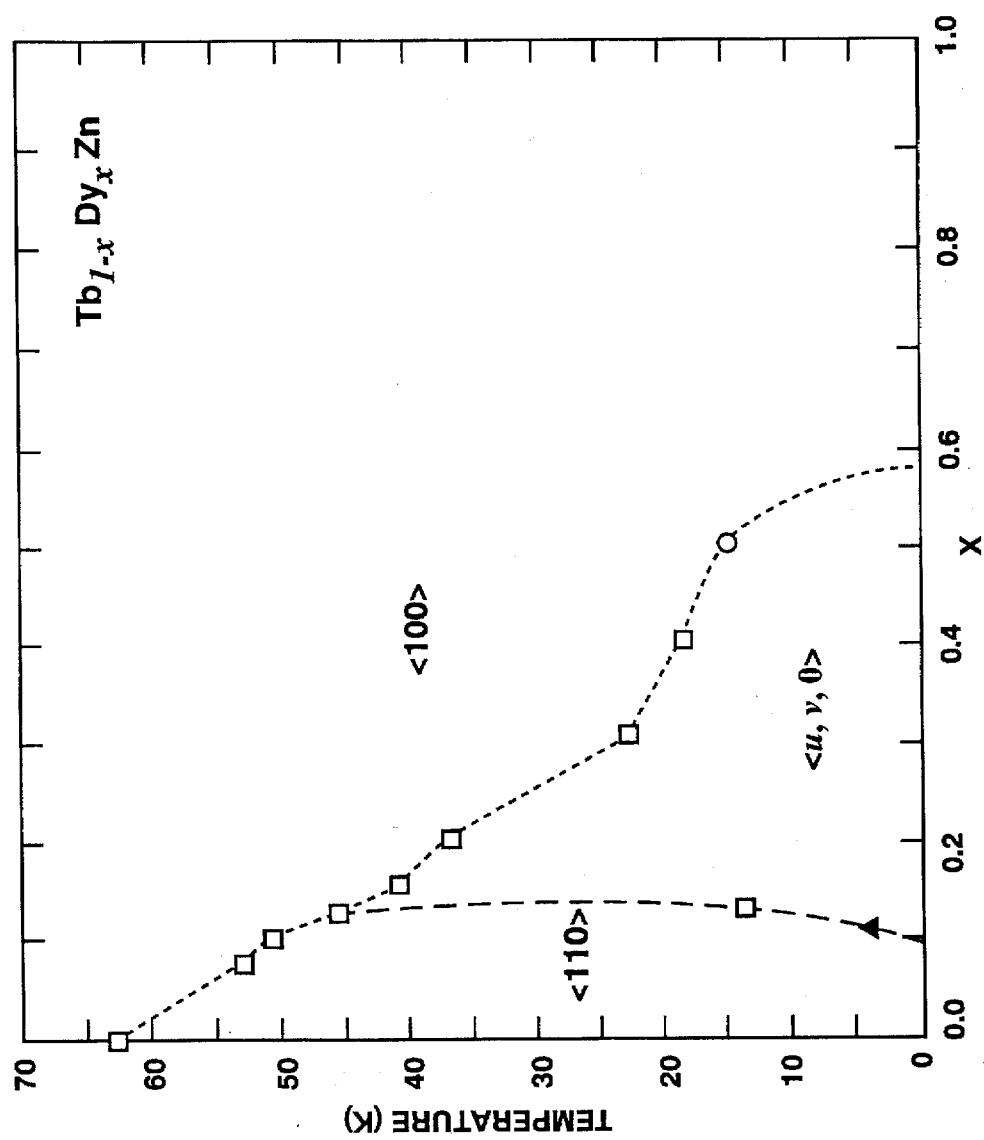
FIG. 1 is a plot of the easy axis transition temperature (T$_R$) versus composition for polycrystalline Tb$_{1-x}$Dy$_x$Zn.

The present invention provides ternary terbium-dysprosium-zinc and ternary terbium-gadolinium-zinc magnetostrictive alloys. The terbium-dysprosium-zinc alloys are represented by the formula Tb$_{1-x}$Dy$_x$Zn$_w$ wherein x is preferably from more than zero to about 0.7, more preferably from 0.3 to about 0.7, and still more preferably from 0.4 to 0.7, and w is preferably from about 0.90 to about 1.10 and more preferably from 0.95 to 1.05. The terbium-gadolinium-zinc alloys are represented by the formula Tb$_{1-y}$Gd$_y$Zn$_w$, wherein y is preferably from more than zero to about 0.4 more preferably from more than zero to about 0.2, and still more preferably from 0.1 to 0.2, and wherein w is from about 0.90 to about 1.10 and more preferably from 0.95 to 1.05.

The Tb$_{1-x}$Dy$_x$Zn$_w$ alloys and the Tb$_{1-y}$Gd$_y$Zn$_w$ alloys may have polycrystalline or single crystal structures. Polycrystalline alloys are produced by the method disclosed in example 2. The molten alloys are simply allowed to cool down to produce a poorly textured (oriented) polycrystalline material. As discussed below, a horizontal levitation zone melting method may be used to produce a highly textured polycrystalline alloy from this poorly textured alloy. The higher the orientation (or texture) of the polycrystalline alloy, the better its magnetostrictive performance. The single crystal alloys are even more preferred with high quality single crystal alloys having angle grain boundaries of less than 5° being most preferred. A method of preparing the single crystal alloys is described below. The greater the orientation of the alloy crystal structure, the more efficient the magnetostrictive alloy material will be in converting magnetic energy into mechanical energy in a magnetostrictive transducer. The $Tb_{1-x}Dy_xZn_w$ and the $Tb_{1-y}Gd_yZn_w$ alloys have cubic CsCl type crystal structures.

Also, in this invention a magnetostrictive element composed of either the $Tb_{1-x}Dy_xZn_w$ alloy or the $Tb_{1-y}Gd_yZn_w$ alloy is used to convert magnetic energy in the form of a change in magnetic field into mechanical energy in the form of a change in dimension in the magnetostrictive element or conversely to convert mechanical energy into magnetic energy by subjecting the magnetostrictive element to a pressure which causes a change in dimension in the element which produces magnetic energy in the form of a change in magnetic field. The conversion of magnetic energy into mechanical energy is used in power transducers and switch activators. The conversion of mechanical energy into magnetic energy is used in passive transducer sensors where pressure against the transducer element produces a change in magnetic field which generates small electrical currents in pickup coils which are connected to detector-amplifiers. Shipboard sonars operate in both the sending mode (magnetic to mechanical) and the receiving mode (mechanical to magnetic). For magnetostrictive transducer operating temperatures over the range of from less than 63K down to just more than 0K, a magnetostrictive element composed of a $Tb_{1-x}Dy_xZn_w$ alloy wherein x and w are as defined above is used. Over the entire temperature range of from less than 63K to more than 0K, a conventional conductor such as copper, copper alloys, aluminum, aluminum alloys, silver, silver alloys, gold, gold alloys, etc. will work. However, a superconductor able to conduct current losslessly at the transducer operating temperature will be more energy efficient as a magnetic field generator or more sensitive as a magnetic field sensor. For operating temperature from about 15K down to near 0K, low temperature superconducting materials such as niobium-zirconium alloys, niobium-titanium alloys, niobium-tin alloys, and aluminum-germanium alloys may be used. For higher temperatures of from about 15K up to less than 63K, high temperature superconductors (HTSC's) are used. The HTSC's include yttrium (Y) based ceramic superconductors such as $YBa_2Cu_3O_{7-x}$, bismuth (Bi) based ceramic superconductors such as $Bi_{0.7}Pb_{0.3}SrCaCu_{1.8}O_x$, and thallium (Tl) based ceramic superconductors such as $Tl_2Ba_2Ca_2Cu_3O_{7-x}$. The composition of the $Tb_{1-x}Dy_xZn_w$ alloy of the magnetostrictive element is selected to minimize the magnetocrystalline anisotropy and thus minimize hysteresis losses in the element during the operation of the transducer. For a magnetostrictive transducer with operating temperatures of from more than 63° K to about 77° K (liquid nitrogen boiling point) a magnetostrictive element composed of a $Tb_{1-y}Gd_yZn_w$ alloy wherein y and w are as defined above is used. Over the entire temperature range of from more than 63° K to about 77° K a conventional conductor or more preferably a high temperature superconductor can be used. Again, the superconductor conducting current losslessly will generate magnetic fields more efficiently or detect changes in magnetic fields more effectively (more sensitive). The composition of the $Tb_{1-y}Gd_yZn_w$ alloy of the magnetostrictive element is selected so that its easy axis transition temperature $(T_R)$ is the temperature at which the transducer is operated at. This minimizes the magnetocrystalline anisotropy and thus minimizes the hysteresis loss in the element during the operation of the transducer.

FIG. 1 is a plot of the easy axis transition temperature $(T_R)$ versus composition (x) for polycrystalline $Tb_{1-x}Dy_xZn$. The magnetization of TbZn (x=0) undergoes an easy axis reorientation at a temperature $T_R$ of 63K; below $T_R$, <110> axes are easy, above $T_R$, <100> axes are easy. The $T_R$ is lowered by substituting dysprosium (Dy) for part of the terbium (Tb). Thus, for TbZn, $T_R$=63K; for $Tb_{0.7}Dy_{0.3}Zn$, 0<$T_R$<30K; and for $Tb_{0.5}Dy_{0.5}Zn$ and $Tb_{0.4}Dy_{0.6}Zn$, 0<$T_R$<15K. Dy and Tb have high magnetic moments, high magnetostrictions, and high magnetic anisotropies. Below 63K the magnetic anisotropy of Tb is directed along the <110> axes whereas the magnetic anisotropy of the Dy is directed in the opposite direction along the <100> axes in the cubic CsCl type crystalline structure. Until the temperature reaches down to about 45K, the magnetic exchange interaction of Tb and Dy are strong enough to override the anisotropies and couple the magnetic moments in the same direction. However, the anisotropies get larger as the temperature decreases, and below about 45K the Tb and Dy magnetic moments may no longer be parallel and the resultant easy axis may lie along a vector <u, v, 0> where u and v are integers and change with temperature and composition.

FIG. 1 is used in selecting the $Tb_{1-x}Dy_xZn_w$ composition as follows. A horizontal line corresponding to the operating temperature of the transducer is run across FIG. 1 until a sloped line is reached. If the sloped line divides the <110> region from the <100> region, the x corresponding to the intersection point on the line defines the optimum composition. However, if the sloped line divides the <110> region from the <u, v, 0> region, the horizontal line is continued until it intersects the sloped line dividing the <u, v, 0> region from the <100> region, where the corresponding x defines an operable $Tb_{1-x}Dy_xZn_w$ composition. By varying the composition slightly, the optimum composition will be found. Note a composition along the <u, v, 0>/<100> line is selected because maximum magnetostriction is achieved along the <100> axis which is the cube edge of the cubic CsCl type crystal. Note: when a superconductor is used, the operating temperature of the transducer will be a temperature at which the superconductor conducts electrical current losslessly. If a conventional conductor (e.g. copper, aluminum, etc.) is used, the operating temperature can be anywhere along the range of from less than 63K to just more than 0K.

Figure 2:
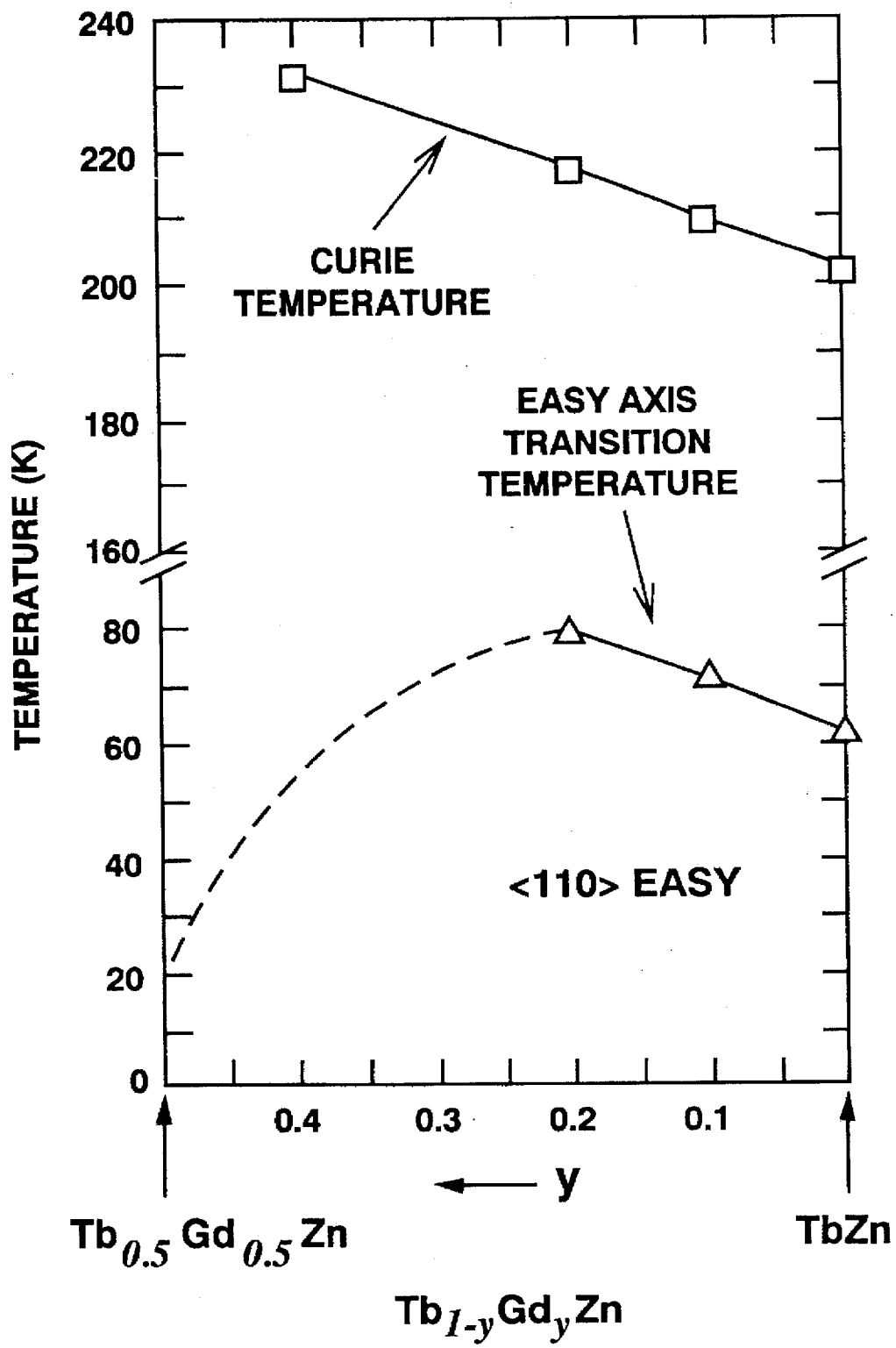
FIG. 2 is a plot of the easy axis transition temperature (T$_R$) versus composition for polycrystalline Tb$_{1-y}$Gd$_y$Zn.

FIG. 2 is a plot of the easy axis transition temperature $(T_R)$ versus composition (y) for polycrystalline $Tb_{1-y}Gd_yZn$. The $T_R$ is raised by substituting gadolinium (Gd) for terbium (Tb). A $T_R$ above the boiling point of nitrogen (77K) is achieved when y is about 0.2. Because Gd has very little magnetostriction, the addition of Gd reduces the magnetostriction of the alloy proportionately.

FIG. 2 can be used to select a composition of $Tb_{1-y}Gd_yZn_w$ such that $T_R$ is equal to the operating temperature. When a superconductor is used, the operating temperature will be a temperature at which the superconductor conducts electrical current losslessly. If a conventional conductor (e.g., copper, aluminum, etc.) is used, the operating temperature can be anywhere along the range of from more than 63K to just above 77K.

Although FIGS. 1 and 2 are plots of polycrystalline $Tb_xDy_{1-x}Zn$ and $Tb_yGd_{1-y}Zn$ materials they apply equally as well to the selection of single crystal $Tb_xDy_{1-x}Zn$ and $Tb_yGd_{1-y}Zn$ materials. Moreover, the magnetostrictive performance of oriented single crystal materials will be markedly better.

Preparation of the rare earth-zinc compound in single crystalline form requires careful processing to minimize any loss of zinc from the melt due to evaporation. Appreciable vaporization of zinc begins at about 600° C., well below the compound's melting point. Tantalum or tungsten are suitable crucible materials as both can be fairly resistant to attack by molten rare earth metals or molten zinc. Therefore, crystal growth is conducted in sealed tantalum or tungsten crucibles.

Single Crystal Materials

An acceptable procedure for preparing the $Tb_{1-x}Dy_xZn_w$ alloys and the $Tb_{1-y}Gd_yZn_w$ alloys is as follows:

1.) A predetermined amount of zinc is placed into the tantalum crucible and melted at 500° C. By tracking the weights of the crucible and zinc during this melting operation, the quantity of zinc loss has been negligible.

2.) Based on the quantity of the zinc, the appropriate quantities of terbium and dysprosium or of terbium and gadolinium are added to the crucible and the crucible is welded shut under an argon atmosphere.

3.) Melting of the zinc and rare earth does not produce a homogenous ingot because of the density differences and large differences in melting temperatures of the components. Therefore, prior to crystal growth the crucible is placed into a furnace in an inverted position and heated to 1200° C. for one hour. This allows liquid zinc to fall around the terbium and dysprosium or the terbium and gadolinium and begin to dissolve the rare earth metals. The crucible is slow cooled and the partially alloyed ingot is solidified at the top of the crucible.

4.) The crucible is transferred to the crystal growth furnace and placed within the furnace in the upright position. As the temperature of the furnace exceeds the melting point, the ingot slides down to the bottom of the crucible allowing for greater mixing. The crucible is held for one hour, approximately 150° C. above the melting point of the compound to assure complete alloying before crystal growth is initiated. The growth rate employed for these compounds is 10 mm/hr.

EXAMPLE 1

To demonstrate the procedure, two crystal growth runs were completed with alloy compositions of $Tb_{0.5}Dy_{0.5}Zn$ and TbZn. Although the tantalum crucible does not react with the molten compound, the crystal boule does stick to the crucible requiring that the tantalum crucible be machined off the ingot. The compound is much tougher than terfenol ($Tb_{0.27}Dy_{0.73}Fe_{1.98}$) and therefore the ingots remained intact. Characterization of both alloy compositions indicated that the entire ingots were single crystalline. The ingots were oriented close to the (100) direction and ¼ inch diameter cylinders were sectioned from the ingots. Chemical analysis of material taken adjacent to the cylinders showed a slight increase in zinc content from stoichiometry.

Polycrystalline Materials

If after the complete alloying of the compound in step 3 (above), the molten compound is simply allowed to cool down, a polycrystalline alloy material could be formed. The product may be a textured polycrystalline material. A grain-oriented polycrystalline alloy material with a high degree of texturing may be formed using apparatus of the type described by O. D. McMasters, G. E. Holland, and K. A. Gschneidner, in "Single Crystal Growth by the Horizontal Levitation Zone Melting Method," Journal of Crystal Growth 43 (1978), pp. 577–583, herein incorporated by reference in its entirety. U.S. Pat. No. 4,308,474, herein incorporated by reference in its entirety, discloses in example 1 the preparation of highly textured grain oriented polycrystalline $Tb_{0.27}Dy_{0.73}Fe_{1.98}$ alloys using this horizontal zone method. This process is modified for the present invention by the use of sealed tungsten or tantalum containers for the $Tb_xDy_{1-x}Zn$ or $Tb_{1-y}Gd_yZn$ alloys.

Although both polycrystalline and highly gain-oriented polycrystalline $Tb_{1-x}Dy_xZn_w$ and $Tb_{1-y}Gd_yZn_w$ alloys are useful in magnetostrictive devices such as transducers, the [100] oriented single crystal form of these alloys is the preferred embodiment.

EXAMPLE 2

Polycrystalline ingots of $Tb_{1-x}Dy_xZn$ ($0 \leq x \leq 0.6$) and $Tb_{1-y}Gd_yZn$ ($0 < y < 0.4$) were prepared at Ames Laboratory using stoichiometric proportions of 99.99% pure Tb, Dy, Gd, and Zn. Twenty gram quantities of each composition were sealed in Ta crucibles and heated to 1300° C. To assure excellent mixing, the melts were furnace cooled, inverted and heated a second time. Small discs (~100 mg) were cut from these samples and mounted in an EG&G vibrating sample magnetometer for magnetization measurements. For transducer measurements, ring samples (~6 mm i.d.×8 mm o.d.×0.8 mm thick) were also cut from the ingot and toroidally wound with a (1) d.c. bias, (2) a.c. excitation and (3) a.c. pickup coils. Using a Fluke 6011A signal generator, Kepco 36-5 operational amplifier and Hewlett-Packard 3570A network analyzer, frequency dependencies of the resistive and reactive components of the toroid's impedances were obtained and analyzed to determine resonant and antiresonant frequencies.

Figure 3:
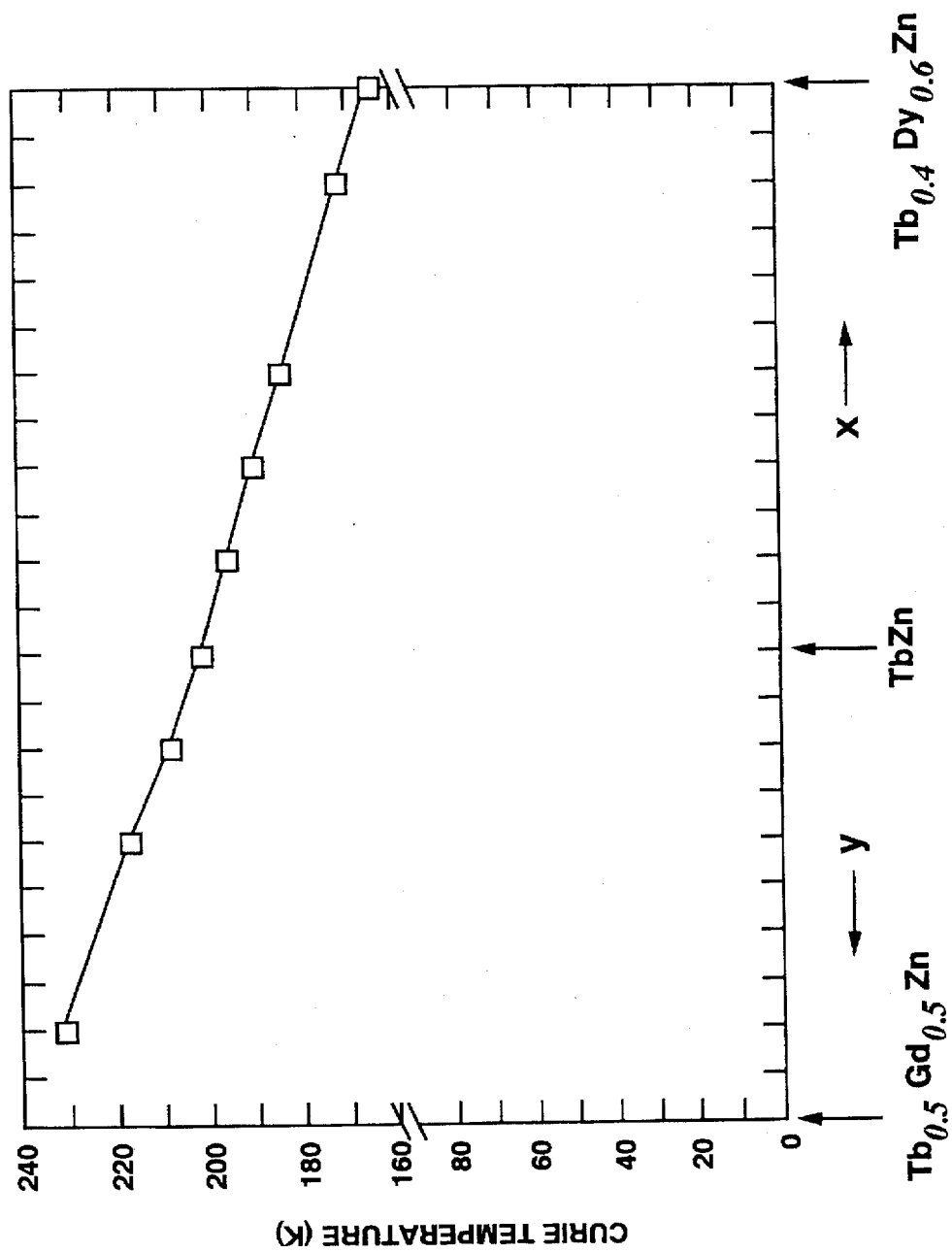
FIG. 3 is a plot of the Curie temperature versus composition for polycrystalline Tb$_{1-x}$D$_x$Zn and for polycrystalline Tb$_{1-y}$Gd$_y$Zn.

Both DyZn and TbZn have extraordinarily large anisotropy constants at low temperature. In these compounds, magnetization occurs via domain wall motion rather than by magnetization rotation. Thus for low loss transduction at these temperatures ($T<<T_c$) it is important to compensate the magnetic anisotropy as much a possible. For TbZn this compensation occurs at 63K. For T<63K, we show that the anisotropy can be minimized by combining TbZn ([110] easy) and DyZn ([100] easy). For T>63K, the anisotropy can be minimized by combining TbZn and GdZn. Easy axis transition temperatures ($T_R$) were determined from curves of magnetization vs. temperature for polycrystalline $Tb_{1-x}Dy_xZn$ (x=0, 0.2, 0.3, 0.5, and 0.6) and $Tb_{1-y}Gd_yZn$ (y=0.1 and 0.2) at non-saturating applied fields. The 63K transition temperature ($T_R$) for TbZn could be clearly seen by the peak in the magnetization vs. temperature curve as the {100} planes become easy. Similar magnetization temperature dependencies were found for $Tb_{0.9}Dy_{0.1}Zn$. However, as the substitution of Dy or Gd for Tb is increased, the transition becomes diffuse. Clear evidence for the broadening is seen for $x \geq 0.3$ and y=0.2. For y=0.4, the transition can no longer be seen. This broadening may be accounted for by a distribution of crystalline fields at the Tb site in each sample arising from the different number of Tb nearest neighbors. For $Tb_{0.7}Dy_{0.3}Zn$, we find $0<T_R<30K$. For this compound, the anisotropy field is estimated to be as low as 10 kOe for T<15K. For TbZn, the anisotropy field is much higher. For x=0.5 and 0.6, $0<T_R<15K$. FIG. 1 presents a plot of transition temperature vs. compositions for $Tb_{1-x}Dy_xZn$ alloys and FIG. 2 presents a plot of transition temperature vs. composition for $Tb_{1-y}Gd_yZn$ alloys. FIG. 3 presents a plot of the Curie temperature vs. composition for both $Tb_{1-x}Dy_xZn$ and $Tb_{1-y}Gd_yZn$ alloys.

Obviously, other modifications and variations of the present invention may be possible in light of the foregoing teachings. It is therefore to be understood that within the scope of the appended claims the invention may be practiced otherwise than as specifically described.

What is claimed is:

1. A crystalline magnetostrictive material of the formula $Tb_{1-x}D_xZn_w$, wherein x is 0.3 to about 0.7 and w is from about 0.90 to about 1.10.

2. The crystalline material of claim 1 that is a polycrystalline material.

3. The polycrystalline material of claim 2 wherein x is from 0.4 to 0.7.

4. The polycrystalline material of claim 2 wherein w is from 0.95 to 1.05.

5. The polycrystalline material of claim 2 that is a highly textured polycrystalline magnetostrictive material.

6. The crystalline material of claim 1 that is a single crystal magnetostrictive material wherein the single crystal material has angle grain boundaries of less than 5°.

7. The single crystal material of claim 6 wherein x is from 0.4 to 0.7.

8. The single crystal material of claim 6 wherein w is from 0.95 to 1.05.

9. A crystalline magnetostrictive material of the formula $Tb_{1-y}Gd_yZn_w$, wherein y is from 0.1 to 0.2 and w is from about 0.90 to about 1.10.

10. The crystalline material of claim 9 that is a polycrystalline material.

11. The polycrystalline material of claim 10 wherein w is from 0.95 to 1.05.

12. The polycrystalline material of claim 10 that is a highly textured polycrystalline material.

13. The crystalline material of claim 9 that is a single crystal magnetostrictive material wherein the single crystal material has angle grain boundaries of less than 5°.

14. The single crystal material of claim 13 wherein w is from 0.95 to 1.05.

15. A transducer for converting magnetic energy into mechanical energy or vice versa comprising:
    A. a magnetostrictive element comprising a crystalline magnetostrictive material of the formula $Tb_{1-x}Dy_xZn_w$, wherein x is from 0.3 to about 0.7 and w is from about 0.90 to about 1.10; and
    B. conductive means for (1) generating a magnetic field in the magnetostrictive element or (2) sensing a change in magnetic field produced by the magnetostrictive element or (3) both.

16. The transducer of claim 15 wherein the crystalline magnetostrictive material is a polycrystalline material.

17. The transducer of claim 16 wherein x is from 0.4 to 0.7.

18. The transducer of claim 16 wherein w is from 0.95 to 1.05.

19. The transducer of claim 16 wherein the polycrystalline magnetostrictive material is a highly textured polycrystalline material.

20. The transducer of claim 15 wherein the crystalline magnetostrictive material is a single crystal magnetostrictive material wherein the single crystal material has angle grain boundaries of less than 5°.

21. The transducer of claim 20 wherein x is from 0.4 to 0.7.

22. The transducer of claim 20 wherein w is from 0.95 to 1.05.

23. The transducer of claim 15 wherein the conductive means uses an ordinary electrical conductor.

24. The transducer of claim 23 wherein the ordinary electrical conductor is selected from the group consisting of copper, copper alloys, aluminum, aluminum alloys, silver, silver alloys, gold, and gold alloys.

25. The transducer of claim 15 wherein the conductive means uses a low temperature superconductor.

26. The transducer of claim 25 wherein the low temperature superconductor is selected from the group consisting of niobium-zirconium alloys, niobium-titanium alloys, niobium-tin alloys, and niobium-germanium alloys.

27. The transducer of claim 15 wherein the conductive means uses a high temperature superconductor.

28. The transducer of claim 27 wherein the high temperature superconductor is selected form the group consisting of ytterium based ceramic superconductors, bismuth based ceramic superconductors, and thallium based ceramic superconductors.

29. A transducer for converting magnetic energy into mechanical energy or vice versa comprising:
    A. a magnetostrictive element comprising a crystalline magnetostrictive material of the formula $Tb_{1-y}Gd_yZn_w$, wherein y is from 0.1 to 0.2 and w is from about 0.90 to about 1.10; and
    B. conductive means for (1) generating a magnetic field in the magnetostrictive element or (2) sensing a change in magnetic field produced by the magnetostrictive element or (3) both.

30. The transducer of claim 29 wherein the crystalline magnetostrictive material is a polycrystalline material.

31. The transducer of claim 30 wherein w is from 0.95 to 1.05.

32. The transducer of claim 30 wherein the polycrystalline magnetostrictive material is a highly textured polycrystalline material.

33. The transducer of claim 29 wherein the crystalline magnetostrictive material is a single crystal magnetostrictive material wherein the single crystal material has angle grain boundaries of less than 5°.

34. The transducer of claim 33 wherein w is from 0.95 to 1.05.

35. The transducer of claim 29 wherein the conductive means uses an ordinary electrical conductor.

36. The transducer of claim 35 wherein the ordinary electrical conductor is selected from the group consisting of copper, copper alloys, aluminum, aluminum alloys, silver, silver alloys, gold, and gold alloys.

37. The transducer of claim 29 wherein the conductive means uses a high temperature superconductor.

38. The transducer of claim 37 wherein the high temperature superconductor is selected from the group consisting of ytterium based ceramic superconductors, bismuth based ceramic superconductors, and thallium based ceramic superconductors.

39. A crystalline magnetostrictive material of the formula $Tb_{1-x}Dy_xZn_w$, wherein x is from more than zero to about 0.7 and w is from about 0.90 to about 1.10.

40. The crystalline material of claim 39 that is a polycrystalline material.

41. The polycrystalline material of claim 40 that is a highly textured polycrystalline magnetostrictive material.

42. The crystalline material of claim 39 that is a single crystal magnetostrictive material wherein the single crystal material has angle grain boundaries of less than 5°.

43. A crystalline magnetostrictive material of the formula $Tb_{1-y}Gd_yZn_w$ wherein y is from more than zero to about 0.4 and w is from about 0.90 to about 1.10.

44. The crystalline material of claim 43 that is a polycrystalline material.

45. The polycrystalline material of claim 44 that is a highly textured polycrystalline material.

46. The crystalline material of claim 43 that is a single crystal magnetostrictive material wherein the single crystal material has angle grain boundaries of less than 5°.

47. A transducer for converting magnetic energy into mechanical energy or vice versa comprising:

A. a magnetostrictive element comprising a crystalline magnetostrictive material of the formula $Tb_{1-x}Dy_xZn_w$, wherein x is from more than zero to about 0.7 and w is from about 0.90 to about 1.10; and B. conductive means for (1) generating a magnetic field in the magnetostrictive element or (2) sensing a change in magnetic field produced by the magnetostrictive element or (3) both.

48. The transducer of claim 47 wherein the crystalline magnetostrictive material is a polycrystalline material.

49. The transducer of claim 48 wherein the polycrystalline magnetostrictive material is a highly textured polycrystalline material.

50. The transducer of claim 47 wherein the crystalline magnetostrictive material is a single crystal magnetostrictive material wherein the single crystal material has angle grain boundaries of less than 5°.

51. The transducer of claim 47 wherein the conductive means uses an ordinary electrical conductor selected from the group consisting of copper, copper alloys, aluminum, aluminum alloys, silver, silver alloys, gold, and gold alloys.

52. The transducer of claim 47 wherein the conductive means uses a low temperature superconductor selected from the group consisting of niobium-zirconium alloys, niobium-titanium alloys, niobium-tin alloys, and niobium-germanium alloys.

53. The transducer of claim 47 wherein the conductive means uses a high temperature superconductor selected from the group consisting of ytterium based ceramic superconductors, bismuth based ceramic superconductors, and thallium based ceramic superconductors.

54. A transducer for converting magnetic energy into mechanical energy or vice versa comprising:

A. a magnetostrictive element comprising a crystalline magnetostrictive material of the formula $Tb_{1-y}Gd_yZn_w$, wherein y is from more than zero to about 0.4 and w is from about 0.90 to about 1.10; and B. conductive means for (1) generating a magnetic field in the magnetostrictive element or (2) sensing a change in magnetic field produced by the magnetostrictive element or both.

55. The transducer of claim 54 wherein the crystalline magnetostrictive material is a polycrystalline material.

56. The transducer of claim 55 wherein the polycrystalline magnetostrictive material is a highly textured polycrystalline material.

57. The transducer of claim 54 wherein the crystalline magnetostrictive material is a single crystal magnetostrictive material wherein the single crystal material has angle grain boundaries of less than 5°.

58. The transducer of claim 54 wherein the conductive means uses an ordinary electrical conductor selected from the group consisting of copper, copper alloys, aluminum, aluminum alloys, silver, silver alloys, gold, and gold alloys.

59. The transducer of claim 54 the conductive means uses a high temperature superconductor selected from the group consisting of ytterium based ceramic superconductors, bismuth based ceramic superconductors, and thallium based ceramic superconductors.

* * * * *